United States Patent [19]
Samra

[11] Patent Number: 5,646,878
[45] Date of Patent: Jul. 8, 1997

[54] CONTENT ADDRESSABLE MEMORY SYSTEM

[75] Inventor: Nicholas G. Samra, Austin, Tex.

[73] Assignee: Motorola, Inc., Schaumburg, Ill.

[21] Appl. No.: 460,353

[22] Filed: Jun. 2, 1995

[51] Int. Cl.$^6$ .................................................. G11C 15/00
[52] U.S. Cl. ........................................ 365/49; 365/189.07
[58] Field of Search ............................... 364/49, 189.07

[56] References Cited

U.S. PATENT DOCUMENTS

| | | | |
|---|---|---|---|
| 4,894,799 | 1/1990 | Hanawa et al. | 365/49 |
| 4,928,260 | 5/1990 | Chuang et al. | 365/49 |
| 5,299,147 | 3/1994 | Holst | 365/49 |

Primary Examiner—Son T. Dinh
Attorney, Agent, or Firm—Lee E. Chastain

[57] ABSTRACT

A CAM system (2) stores a plurality of data sets in a plurality of pairs of CAM cells (4) and RAM cells (6). The portion of a particular data set stored in one of the RAM cells is accessed by inputting a tag to CAM cells that matches the portion of the data set stored in the CAM cell associated with the particular RAM cell. CAM system incorporates a novel two-stage matchline re-coding scheme to improve performance. Each of a plurality of first stage circuits (10) receives a plurality of matchline signals from a plurality of CAM sets and a plurality of data inputs from the corresponding RAM sets. Each output of the first stage circuits is further processed by a second stage circuit (12) which generates the final data output. The CAM system avoids the use of self-timed control signals and sense amplifiers.

7 Claims, 3 Drawing Sheets

CONTENT ADDRESSABLE MEMORY SYSTEM

FIELD OF THE INVENTION

The present invention generally relates to digital memory systems, and more specifically to a content addressable memory.

BACKGROUND OF THE INVENTION

A content addressable memory system (hereafter simply a CAM system) is a memory system in which individual memory elements are not exclusively indexed by a unique address. Instead, a memory element in a CAM system may be addressed by a portion of the data within the memory element. The way in which a memory cell in a CAM system is addressed distinguishes a CAM system from a conventional random access memory (RAM) or a read only memory (ROM) system.

A particular data word stored in a RAM cell or a ROM cell is accessed by supplying a unique address to the memory system associated with the desired memory element. In a CAM memory system, a "tag" is supplied to the memory system. The CAM memory system compares the tag to a subset of the data bits contained in each memory element. Generally, the portion of each memory element that contains this subset of memory bits is referred to as the CAM. The CAM portion typically has several CAM cells within it. Each CAM cell stores one data bit. Each CAM, or group of CAM cells, is associated with a conventional memory element storing other data bits. The CAM that contains data bits logically equivalent to the input tag "matches" and asserts a logic signal referred to as a "matchline." The asserted matchline causes the CAM memory system to output the other data bits associated with the matching CAM. These other data bits are the desired data bit, byte, word, etc.

CAM systems are particularly useful as caches in data processing environments. In such environments, CAM systems store a subset of frequently used data in a plurality of RAM memory elements. The frequently used data might be instructions to execute in the data processing system, operands of the executed instructions, or a combination of both instructions and operands. In these cases, the CAM system would be called an instruction cache, a data cache, or a unified cache, respectively. Or, the frequently data might be used to convert internal virtual memory addresses into external real memory addresses. In this case, the CAM system would be called a translation look aside cache (or buffer). In all cases, an associated tag identifies the data stored in each corresponding CAM portion. In the case of an instruction, data or unified cache, the tag identifies a memory address in memory space from which the data originated. In the case of a translation look aside cache, the tag identifies the virtual memory addresses for which the associated translation is valid.

Known CAM systems suffer several disadvantages arising primarily from their complexity. First, known CAM systems typically require two timing signals to operate properly. One of these timing signals gates the CAM matchlines before the matchlines reach the wordlines of the RAM cells. This first timing signal prevents the matchlines from indicating a false match during precharge and tag input equalization. A second of these timing signals may enable the sense amplifier connected to the output of the RAM array. This second timing signal prevents the sense amplifier from turning on until the voltages on the RAM bitlines begin to separate, preventing a false output. Both of these timing signals require circuits to generate them, resources to test them, etc. Second, the use of these two timing signals slows down the cycle time of the CAM system. Both signals must be generated to operate correctly in all situations, including the slowest matchline generation condition and the slowest bitline separation condition. Therefore, the two timing signals must be generated "conservatively," guaranteeing proper operation in all conditions and throughout all manufacturing process variations.

BRIEF DESCRIPTION OF THE DRAWINGS

The features and advantages of the present invention will be more clearly understood from the following detailed description taken in conjunction with the accompanying FIGURES where like numerals refer to like and corresponding parts and in which.

DETAILED DESCRIPTION OF A PREFERRED EMBODIMENT

Figure 1:
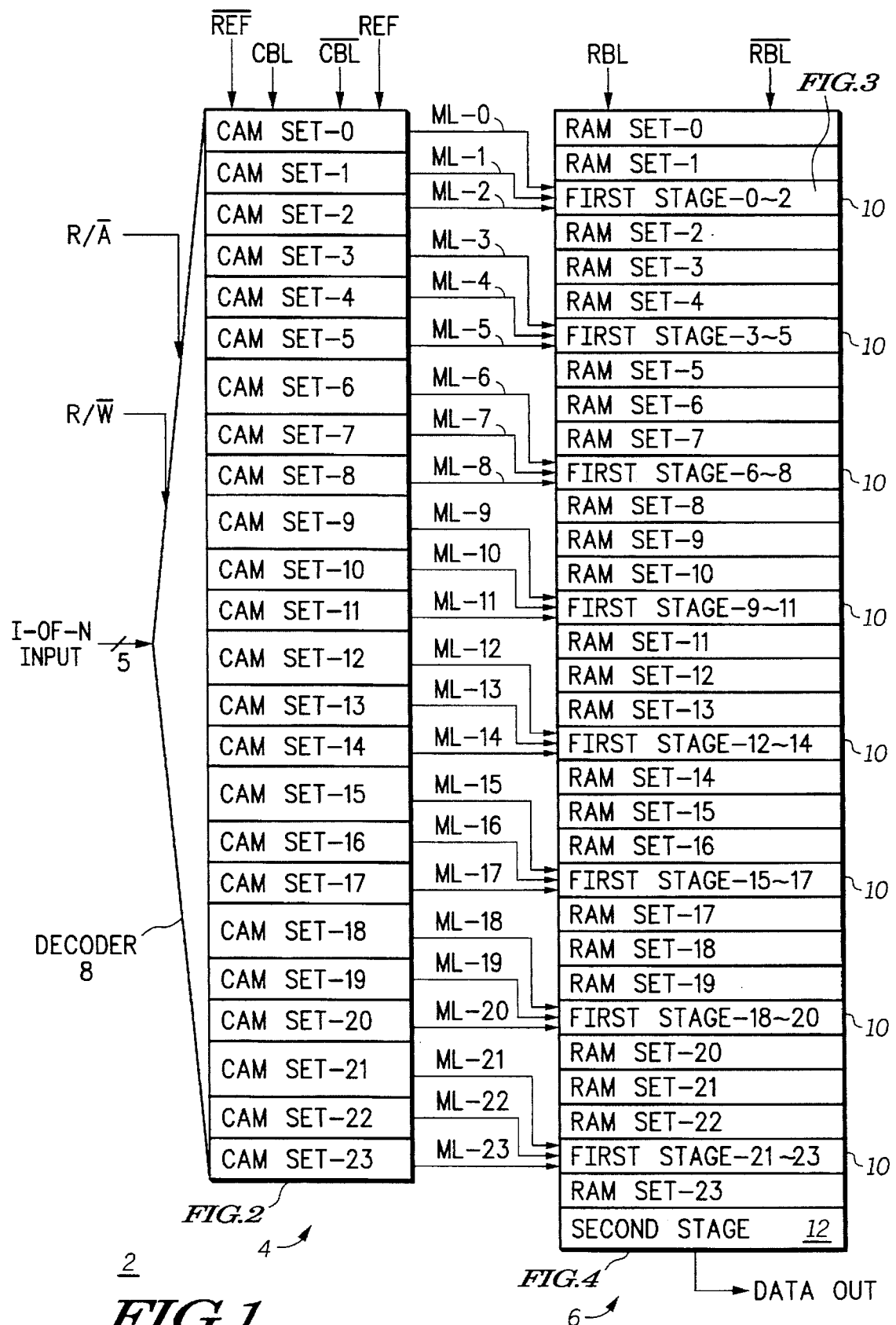
FIG. 1 depicts a CAM system constructed in accordance with the present invention.

FIG. 1 depicts a CAM system 2 constructed in accordance with the present invention. CAM system 2 stores a plurality of data sets in a plurality of pairs of CAM cells 4 (labeled CAM SET-0 through CAM SET-23) and RAM cells 6 (labeled RAM SET-0 through RAM SET-23). The portion of a particular data set stored in one of RAM cells 6 is accessed by inputting a tag to CAM cells 4 that matches the portion of the data set stored in the CAM cell associated with the particular RAM cell. CAM system 2 incorporates a novel two-stage matchline re-coding scheme to improve performance. The novel design of CAM system 2 eliminates two timing control signals, the circuits needed to generate them, and the cycle time impact caused by them. Also, CAM system 2 does not require sense amplifiers to operate.

Continuing with FIG. 1, CAM system 2 also contains a decoder 8 to support register-like operations. Decoder 8 receives a five bit input and selects one of twenty-four data pairs in CAM system 2 by asserting the wordline (shown in FIG. 2) of the appropriate data pair. A read/write control signal (labeled R/$\overline{W}$) determines whether data is written into or read from CAM cells 4 via a set of dual-ended bitlines (labeled CBL and $\overline{CBL}$). Similarly, the read/write control signal determines whether data is written into RAM cells 6 via a set of dual-ended bitlines (labeled RBL and $\overline{RBL}$) or read from RAM cells 6 via a set of single-ended bitlines (labeled DATA OUT). A register/array control signal (labeled R/$\overline{A}$) determines whether CAM system 2 acts like a register file (R) or acts like an array ($\overline{A}$). If CAM system 2 acts like a register file, then data is accessed by decoder 8. If CAM system 2 acts like an array, then data is accessed by a comparison match operation. Comparison data for match operations is input to CAM cells 4 via a set of dual-ended reference input signals (labeled REF and $\overline{REF}$). CAM cells 4 are described below in connection with FIG. 2. The number of CAM bits in each CAM cell (number of columns) determines the number of reference input signals and CAM bitlines. Similarly, the number of RAM bits in each RAM cell (number of columns) determines the number of RAM bitlines.

Each one of CAM cells 4 generates a differing matchline signal (labeled ML-0 through ML-23). These signals are processed in groups by a differing one of a plurality of first stage circuits 10 (shown in FIG. 3). First stage circuits 10 are interspersed among RAM cells 6 (labeled FIRST STAGE-0~2,FIRST STAGE-3~5,FIRST STAGE-6~8,FIRST STAGE-9~11, FIRST STAGE-12~14,FIRST STAGE-15~17,FIRST STAGE-18~20, and FIRST STAGE-21~23). Each group in the depicted embodiment receives three matchlines. First stage circuits 10 are described below in connection with FIG. 3. An output of each first stage circuit 10 is connected to a second stage circuit 12. Second stage circuit 12 generates the single-ended data output, DATA OUT. Second stage circuit 12 is described below in connection with FIG. 4.

The generic functionality of CAM system 2 is known in the art. In general, CAM system 2 performs three functions: compare, read, and write. In a compare operation, a tag and its logical complement are input to CAM cells 4 via the reference bit lines. If the contents of one of the CAM cells is logically equivalent to the input tag, then the matching CAM cell will assert its associated matchline causing the corresponding RAM cell to output its contents through DATA OUT. In a read operation, a binary index is input to CAM cells 4 via decoder 8. The CAM cell and the RAM cell identified by the index will connect their bits cells to CBL/$\overline{CBL}$ and to RBL/$\overline{RBL}$, respectively. In a write operation, a binary index is input to CAM cells 4 via decoder 8 to select a data pair. The CAM cell and the RAM cell so identified will connect their bit cells to CBL/$\overline{CBL}$ and to RBL/$\overline{RBL}$, respectively. The data values present on these bitlines are thereby written into the various bit cells.

Figure 2:
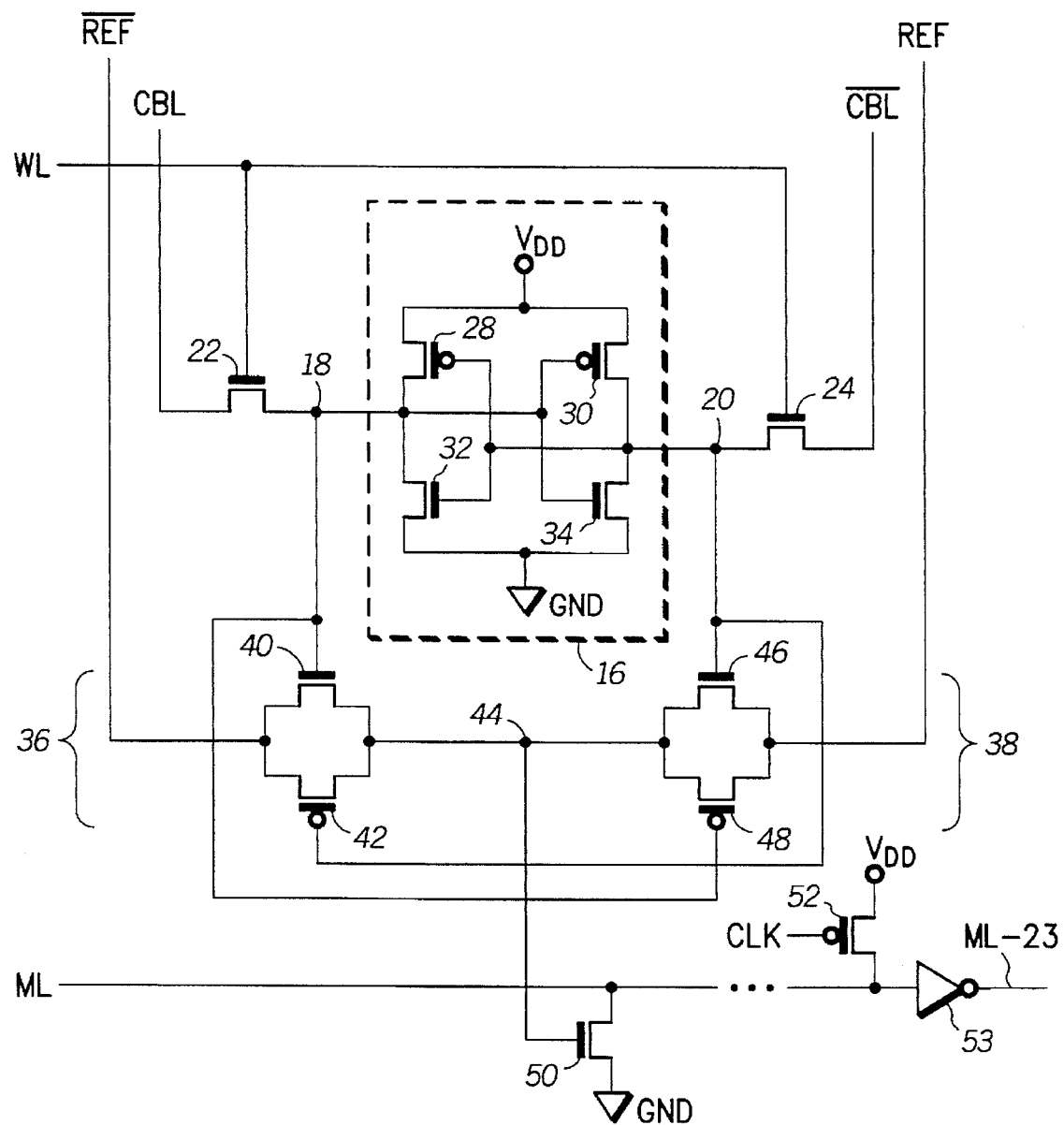
FIG. 2 depicts a CAM cell illustrated in FIG. 1.

FIG. 2 depicts a CAM cell 14 illustrated in FIG. 1. As indicated in FIG. 1, this particular CAM cell 14 is the final CAM cell in CAM cells 4, generating ML-23. CAM cell 14 is designed around a bit cell 16. Bit cell 16 is a six transistor (6-T) memory bit cell that has two stable logic states corresponding to the two possible logic states in a binary logic system. Bit cell 16 stores a data bit at a first node 18 and the logical complement of the data bit at a second node 20. Nodes 18 and 20 are connected to the bitline signal through N-channel transistor 22 and to the logical complement of the bitline signal through N-channel transistor 24, respectively. In particular, node 18 is connected to a first current electrode of transistor 22. A second current electrode of transistor 22 is connected to the bitline signal. Node 20 is connected to a first current electrode of transistor 24. A second current electrode of transistor 24 is connected to the bitline bar signal. The control electrodes of each of transistors 22 and 24 is connected to a wordline control signal (labeled WL). Decoder 8 asserts the wordline control signal as described above in connection with FIG. 1.

In the disclosed embodiment, bit cell 16 has a first transistor 28, a second transistor 30, a third transistor 32 and a fourth transistor 34. A first current electrode of transistor 28 and a first current electrode of transistor 30 are connected to a terminal of a first voltage supply (labeled $V_{DD}$). A second current electrode of transistor 28 and a second current electrode of transistor 30 are connected to node 18 and to node 20, respectively. A control electrode of transistor 28 and a control electrode of transistor 30 are connected to node 20 and to node 18, respectively. A first current electrode of transistor 32 and a first current electrode of transistor 34 are connected to a terminal of a second voltage supply (labeled GND). A second current electrode of transistor 32 and a second current electrode of transistor 34 are connected to node 18 and to node 20, respectively. A control electrode of transistor 32 and a control electrode of transistor 34 are connected to node 20 and to node 18, respectively. As depicted, transistors 28 and 30 are P-channel devices. Transistors 32 and 34 are N-channel devices. CAM cell 14 has transistor pairs or pass gates 36 and 38. Transistor pair 36 has an N-channel transistor 40 and a P-channel transistor 42. A first current electrode of each of transistors 40 and 42 is connected to the logical complement of the reference input signal. A second current electrode of each of transistors 40 and 42 is connected to a node 44. A control electrode of transistor 40 is connected to node 18. A control electrode of transistor 42 is connected to node 20. Transistor pair 38 has an N-channel transistor 46 and a P-channel transistor 48. A first current electrode of each of transistors 46 and 48 is connected to the reference input signal. A second current electrode of each of transistors 46 and 48 is connected to node 44. A control electrode of transistor 46 is connected to node 20. A control electrode of transistor 48 is connected to node 18. Node 44 is connected to a control electrode of a transistor 50. A first current electrode of transistor 50 discharges a matchline node, generating a matchline signal (labeled ML). A second current electrode of transistor 50 is connected to the second voltage supply (labeled GND).

It should be understood that there is one instance of CAM cell 14 for each bit in each CAM cell of CAM cells 4. Each transistor 50 is connected to the same matchline node for each CAM cell within the same CAM cell set. Finally, the matchline node is connected to a single P-channel transistor 52 and to an inverter 53. Transistor 52 precharges the matchline node each cycle and inverter 53 generates the proper polarity of each output signal. A first current electrode of transistor 52 is connected to the first voltage supply (labeled $V_{DD}$). A second current electrode of transistor 52 is connected to the matchline node. A control electrode of transistor 52 receives a periodic clocking signal (labeled CLK). Transistor 52 and other precharge transistors described herein may be replaced with an N-channel transistor to ease layout constraints. In such a case, the logical complement of the periodic clock signal (labeled $\overline{CLK}$) would be connected to the control electrode of the precharge transistor. The matchline node signal is connected to an input of inverter 53. An output of inverter 53 generates the control signal ML-23.

As a subcircuit of CAM system 2, CAM cell 14 also performs three functions: compare, read, and write. During a compare operation, each CAM cell 14 within a CAM set has the opportunity to discharge the same associated matchline node if its contents differs from the input tag bit. During a read function, decoder 8 asserts the wordline (labeled WL), coupling bit cell 16 to the CAM bitlines. A sense amplifier (not shown) coupled to the CAM bitlines senses the logic state stored in bit cell 16 and outputs the stored data bit. Decoder 8 also asserts a similar wordline control signal to the associated RAM set. The associated RAM set is thereby coupled to the RAM bitlines and to another sense amplifier. During a write operation, decoder 8 asserts the wordline (labeled WL), coupling bit cell 16 to the CAM bitlines. An input driver (not shown) coupled to the CAM bitlines overwrites the desired logic state into bit cell 16. The same circuit also asserts the wordline control signal to the associated RAM set. Again, the associated RAM set is coupled to the RAM bitlines and to another input driver.

Figure 3:
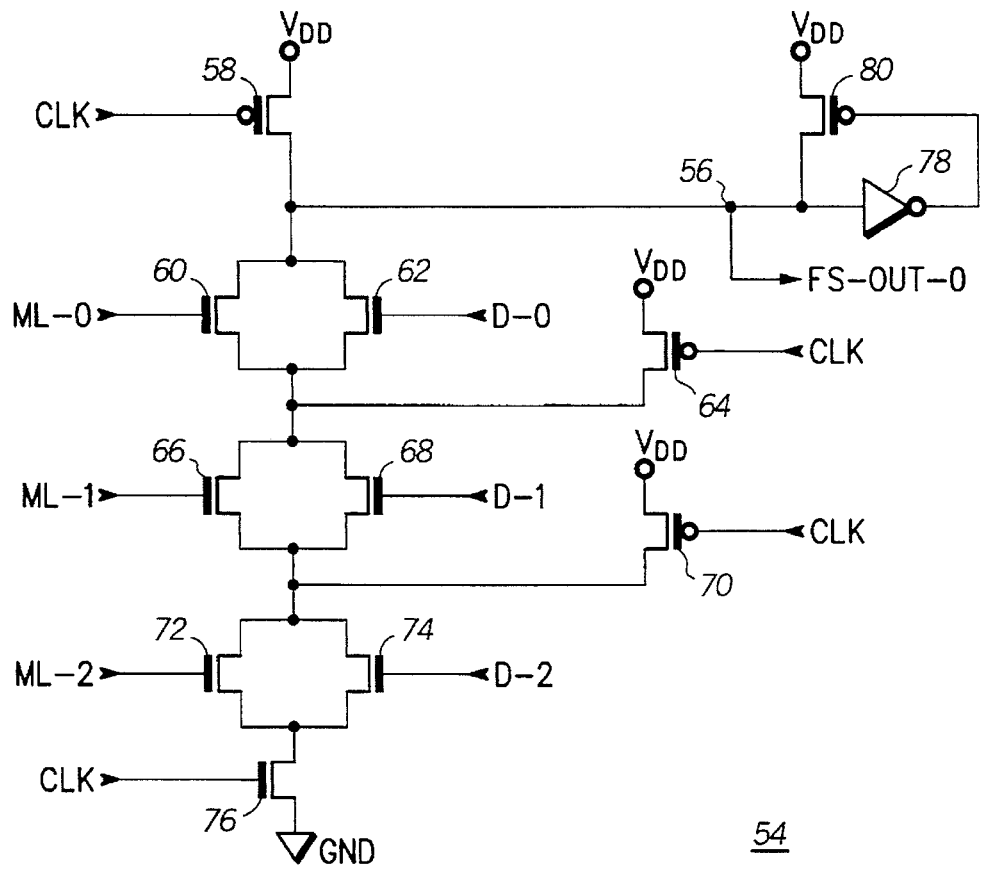
FIG. 3 depicts one of the first stage circuits illustrated in FIG. 1.

FIG. 3 depicts one of the first stage circuits 10 illustrated in FIG. 1. As indicated in FIG. 1, this particular first stage circuit 54 receives matchlines ML-0 though ML-2 and is placed among RAM cells 0 through 2. In the depicted embodiment, each first stage circuit is physically placed between the first stage circuit's second and third RAM sets. An intermediate output node 56 is connected to an M-high stack of transistor pairs, where M is an integer equal to the number of matchlines connected to each first stage circuit. Each transistor pair contains two N-channel transistors in parallel and a precharge P-channel transistor. Intermediate output node 56 generates the output of first stage circuit 54 (labeled FS-OUT-0).

Specifically, intermediate output node 56 is connected to a first current electrode of transistors 58, 60, and 62. A second current electrode of transistor 58 is connected to the first voltage supply control elec). A control electrode of transistor 58 receives the periodic clocking signal (labeled CLK). A control electrode of transistor 60 is connected to the first matchline received by first stage circuit 54, here ML-0. A control electrode of transistor 62 is connected to the data output of the first RAM set received by first stage circuit 54, here D-0. Each bit cell in RAM cells 6 may be implemented with a 6-T bit cell such as the one depicted in FIG. 2 (bit cell 16 and wordline transistors 22 and 24). In such a case, node 18 can be connected to the control electrode of transistor 62.

Continuing with the second portion of the N level stack, a second current electrode of transistors 60 and 62 are connected to a first current electrode of transistors 64, 66 and 68. A second current electrode of transistor 64 is connected to the first voltage supply (labeled $V_{DD}$)- A control electrode of transistor 64 receives the periodic clocking signal (labeled CLK). A control electrode of transistor 66 is connected to the second matchline received by first stage circuit 54, here ML-1. A control electrode of transistor 68 is connected to the data output of the second RAM set received by first stage circuit 54, here D-1.

Continuing with the third portion of the N level stack, a second current electrode of transistors 66 and 68 are connected to a first current electrode of transistors 70, 72 and 74. A second current electrode of transistor 70 is connected to the first voltage supply (labeled $V_{DD}$)- A control electrode of transistor 70 receives the periodic clocking signal (labeled CLK). A control electrode of transistor 72 is connected to the third matchline received by first stage circuit 54, here ML-2. A control electrode of transistor 68 is connected to the data output of the second RAM set received by first stage circuit 54, here D-2. Finally, a second current electrode of transistors 72 and 74 are connected to a first current electrode of an N-channel transistor 76. A second current electrode of transistor 76 is connected to the second voltage supply (labeled GND). A control electrode of transistor 76 receives the periodic clocking signal (labeled CLK).

An inverter 78 and a P-channel transistor 80 maintain the high precharge voltage level on intermediate output node 56 when transistors 60, 62, 66, 68, 72 and 74 evaluate to a high voltage level ($V_{DD}$). Intermediate node 56 is connected to an input of inverter 78. An output of inverter 78 is connected to a control electrode of transistor 80. A first current electrode of transistor 80 is connected to the first voltage supply (labeled $V_{DD}$). A second current electrode of transistor 80 is connected to the input of inverter 78.

It should be understood that there is one instance of first stage circuit 54 for each column of bits in RAM cells 6. The second column bits in the first three RAM cells are connected to the control electrodes of transistors 62, 68, and 74, respectively, in the second instance of first stage circuit 54, the third column bits in the first three RAM cells are connected to the control electrodes of transistors 62, 68, and 74, respectively, in the third instance of first stage circuit 54, etc.

Figure 4:
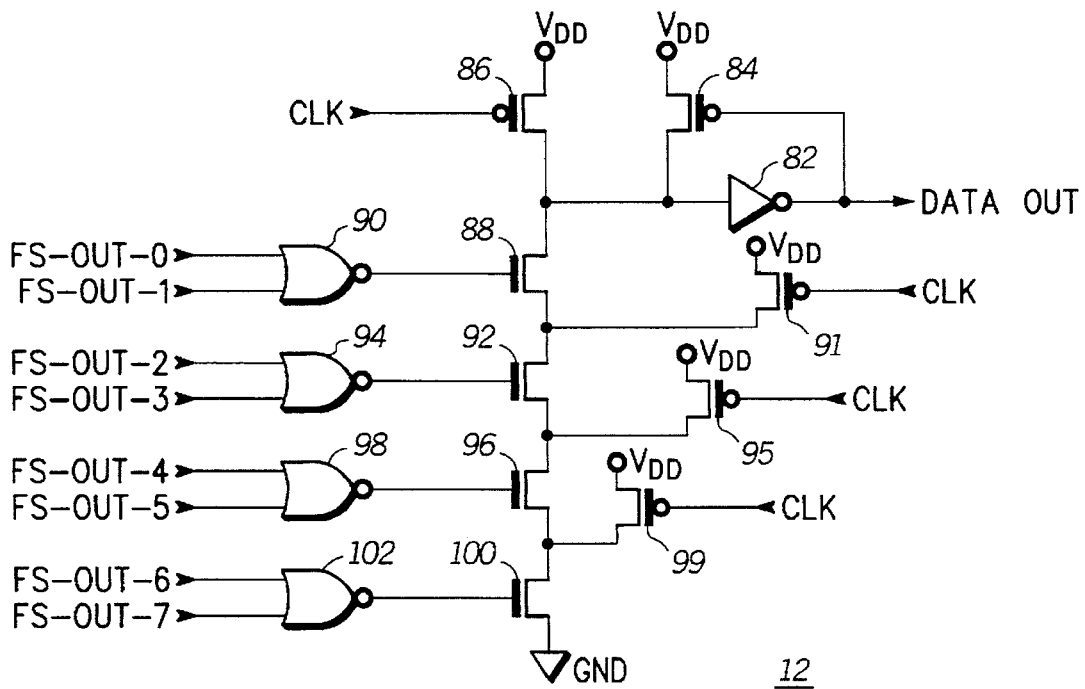
FIG. 4 depicts a second stage circuit illustrated in FIG. 1.

FIG. 4 depicts the second stage circuit 12 illustrated in FIG. 1. An output of an inverter 82 generates the output signal DATA OUT. The output of inverter 82 is also connected to a control electrode of an N-channel transistor 84. A first current electrode of transistor 84 is connected to an input of inverter 82. A second current electrode of transistor 84 is connected to the first voltage supply (labeled $V_{DD}$). The input of inverter 82 is also connected to a K-high stack of N-channel transistors and precharge P-channel transistors, where K is an integer. The control electrodes of the transistors in the stack are connected to a differing one of four two-input NOR gates. Each of the NOR gates receives the output of two of the eight first stage circuits 10.

Specifically, the input of inverter 82 is connected to a first current electrode of a P-channel precharge transistor 86 and to a first current electrode of an N-channel transistor 88. A second current electrode of transistor 86 is connected to the first voltage supply (labeled $V_{DD}$) A control electrode of transistor 86 receives the periodic clocking signal (labeled CLK). A control electrode of transistor 88 is connected to an output of a two input NOR gate 90. A first input and a second input of NOR gate 90 receive the output of the first and second first stage circuits 10, respectively.

Continuing with the second portion of the K level stack, a second current electrode of transistor 88 is connected to a first current electrode of a P-channel precharge transistor 91 and to a first current electrode of an N-channel transistor 92. A second current electrode of transistor 91 is connected to the first voltage supply (labeled VDD). A control electrode of transistor 91 receives the periodic clocking signal (labeled CLK). A control electrode of transistor 92 is connected to an output of a two input NOR gate 94. A first input and a second input of NOR gate 94 receive the output of the third and fourth first stage circuits 10, respectively.

Continuing with the third portion of the K level stack, a second current electrode of transistor 92 is connected to a first current electrode of a P-channel precharge transistor 95 and to a first current electrode of an N-channel transistor 96. A second current electrode of transistor 95 is connected to the first voltage supply (labeled VDD). A control electrode of transistor 95 receives the periodic clocking signal (labeled CLK). A control electrode of transistor 96 is connected to an output of a two input NOR gate 98. A first input and a second input of NOR gate 94 receive the output of the fifth and sixth first stage circuits 10, respectively.

Continuing with the fourth portion of the K level stack, a second current electrode of transistor 96 is connected to a first current electrode of a P-channel precharge transistor 99 and to a first current electrode of an N-channel transistor 100. A second current electrode of transistor 99 is connected to the first voltage supply (labeled $V_{DD}$). A control electrode of transistor 99 receives the periodic clocking signal (labeled CLK). A control electrode of transistor 100 is connected to an output of a two input NOR gate 102. A first input and a second input of NOR gate 102 receive the output of the seventh and eighth first stage circuits 10, respectively. The second current electrode of transistor 100 is connected to the first voltage supply (labeled GND).

It should be understood that there is one instance of second stage circuit 12 for each column of bits in RAM cells 6. In such a case, the inputs to the four NOR gates receive the outputs of the eight first stage circuits 10 of the particular bit column.

The operation of CAM system 2 during a comparison match operation will be described in connection with FIGS 1 through 4. Initially, the periodic clock signal (labeled CLK) is de-asserted, precharging the various matchlines (FIG. 2), the various intermediate output nodes 56 (FIG. 3), and the input to inverter 82 (FIG. 4). The actual comparison match operation begins when the periodic clock signal transitions to a high logic state. Then, either of two events occurs: (1) none of the contents of CAM cells 4 matches the input tag, or (2) the contents of one CAM set in CAM cells 4 matches the input tag.

In the first case, none of the contents of CAM cells 4 matches the input tag. All of the matchlines are de-asserted and are inverted to a high logic state by the various instances of inverter 53. The high logic state of each matchline couples intermediate output node 56 to the second voltage supply (labeled GND) via transistors 60, 66, 72, and 76. This path thereby discharges intermediate output node 56. As described above, intermediate output node 56 is connected to one of NOR gates 90, 94, 98, and 102. The remaining inputs to NOR gates 90, 94, 98, and 102 are all similarly deasserted since no other CAM cell matches the input tag. Transistors 88, 92, 96, and 100 are conductive and couple the input to inverter 82 to the second voltage supply (labeled GND). Inverter 82 outputs a high logic state through the output DATA OUT.

In the second case, one CAM set matches the input tag. This CAM set is the only CAM set that does not discharge its matchline. This one matchline signal, inverted by an instance of inverter 53, remains in a low state. The two other matchline signals discharge, causing their inputs to first stage circuit 54 to transition to a high logic state. Intermediate output node 56 outputs the logical complement of the data value associated with the matching CAM cell. For instance, if the first CAM set matches the input tag, then one instance of inverter 53 will de-assert ML-0. Intermediate output node 56 will discharge to a low logic state via transistors 62, 66, 72, and 76 if the data value D-0 corresponds to high logic state. Conversely, intermediate output node 56 will remain in a high logic state if the data value D-0 corresponds to low logic state. As described above, at least three of the four transistors 88, 92, 96, and 100 will be in a conductive state. The fourth transistor will be in a non-conductive state if the matching data field asserted FS-OUT (data corresponding to a low logic level). In this case, the input to inverter 82 will not discharge, but instead will output a low logic level (correct data polarity). If the matching data field de-asserted FS-OUT (data corresponding to a high logic level), then the input to inverter 82 will discharge, outputting a high logic level (also correct data polarity).

Although the present invention has been described with reference to a specific embodiment, further modifications and improvements will occur to those skilled in the art. For instance, the number of matchlines input to each first stage circuit 10 and the number of NOR gates in second stage circuit 12 may be varied to suit a particular implementation. Also, although certain portions of the described circuit are "dynamic" (precharged) and certain portions are "static" (not precharged), one skilled in the art may make various substitutions to suit other implementations of the disclosed invention. It is to be understood therefore, that the invention encompasses all such modifications that do not depart from the spirit and scope of the invention as defined in the appended claims.

What is claimed is:

1. A content addressable memory system comprising:

a first plurality of content addressable memory (CAM) sets, each one of the first plurality of CAM sets comprising a CAM bit cell, each one of the first plurality of CAM sets generating a differing one of a first plurality of matchline signals;

a first plurality of memory sets, each one of the first plurality of memory sets generating a differing one of a first plurality of data bits, each one of the first plurality of memory sets associated with a differing one of the first plurality of CAM sets;

a first-first stage circuit, the first-first stage circuit receiving the first plurality of data bits and the first plurality of matchline signals, the first-first stage circuit outputting a first logic value if none of the first plurality of matchline signals is representative of a CAM match, the first-first stage circuit outputting a second logic value representative of one of the first plurality of data bits if one of the first plurality of matchline signals is representative of a CAM match;

a second plurality of content addressable memory (CAM) sets, each one of the second plurality of CAM sets comprising a CAM bit cell, each one of the second plurality of CAM sets generating a differing one of a second plurality of matchline signals;

a second plurality of memory sets, each one of the second plurality of memory sets generating a differing one of a second plurality of data bits, each one of the second plurality of memory sets associated with a differing one of the second plurality of CAM sets;

a second-first stage circuit, the second-first stage circuit receiving the second plurality of data bits and the second plurality of matchline signals, the second-first stage circuit outputting the first logic value if none of the second plurality of matchline signals is representative of a CAM match, the second first stage circuit outputting a third logic value representative of one of the second plurality of data bits if one of the second plurality of matchline signals is representative of a CAM match; and a second stage circuit coupled to the first- and second-first stage circuits, the second stage circuit outputting a fourth logic state if both the first and second-first stage circuits output the first logic state, otherwise, the second stage circuit outputting one of either the first plurality of data bits or the second plurality of data bits.

2. The content addressable memory system of claim 1 wherein the first-first stage circuit and the second-first stage circuit each further comprise:

an intermediate output node; and a plurality of pairs of transistors coupled in series between the intermediate output node and a voltage supply, each one of the plurality of pairs of transistors comprising a first and a second transistor coupled in parallel, a control electrode of the first transistor receiving a matchline signal, a control electrode of the second transistor receiving a data bit.

3. The content addressable memory system of claim 2 wherein the second stage circuit comprises:

a final output node; and a plurality of transistors coupled in series between the final output node and the voltage supply, a control electrode of each one of the plurality of transistors coupled to an output of the first-first stage circuit or the second-first stage circuit.

4. The content addressable memory system of claim 3 wherein the plurality of transistors coupled in series further comprises a plurality of logic gates, each one of the plurality of logic gates coupled to the control electrode of a differing one of the plurality of transistors.

5. A content addressable memory system comprising:

J*K data pairs, where J and K are integers greater than or equal to two, each of the J*K data pairs comprising:
   a content addressable memory (CAM) portion storing a tag and asserting a matchline signal if an input tag is logically equivalent to the tag;
   a memory portion storing a data word;

K first stage circuits, each one of the K first stage circuits receiving J matchline signals and J data words, each one of the K first stage circuits outputting either a first voltage level or a first signal representative of one of the J data words responsive to the J matchline signals, each one of the K first stage circuits further comprising:
   an intermediate output node;
   a plurality of pairs of transistors coupled in series between the intermediate output node and a voltage supply, each one of the plurality of pairs of transistors comprising a first and a second transistor coupled in parallel, a control electrode of the first transistor receiving one of the J matchline signals, a control electrode of the second transistor receiving a data bit of one of the J*K data words; and a second stage circuit receiving K outputs of the K first stage circuits, the second stage circuit outputting a second voltage level or a second signal representative of one of the J data words responsive to K outputs of the K first stage circuits.

6. The content addressable memory system of claim 5 wherein the second stage circuit comprises a plurality of second stage bit cell circuits, wherein each one of the plurality of second stage bit cell circuits comprises:
   a final output node; and
   a plurality of transistors coupled in series between the final output node and the voltage supply, a control electrode of each one of the plurality of transistors coupled to an output of one of the plurality of first stage bit cell circuits.

7. The content addressable memory system of claim 6 wherein the plurality of transistors coupled in series further comprises a plurality of logic gates, each one of the plurality of logic gates coupled to the control electrode of a differing one of the plurality of transistors.

* * * * *